United States Patent
Newton et al.

(10) Patent No.: US 8,319,534 B2
(45) Date of Patent: Nov. 27, 2012

(54) PHASE-LOCKED LOOP

(75) Inventors: Timothy John Newton, Suffolk (GB); Nicolas Sornin, La Tronche (FR)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/147,615

(22) PCT Filed: Jan. 11, 2010

(86) PCT No.: PCT/EP2010/050219
§ 371 (c)(1),
(2), (4) Date: Dec. 13, 2011

(87) PCT Pub. No.: WO2010/089168
PCT Pub. Date: Aug. 12, 2010

(65) Prior Publication Data
US 2012/0098578 A1 Apr. 26, 2012

(30) Foreign Application Priority Data
Feb. 3, 2009 (GB) .................................. 0901726.0

(51) Int. Cl.
*H03L 7/06* (2006.01)
(52) U.S. Cl. .......... 327/156; 327/147; 331/17; 332/127; 375/376
(58) Field of Classification Search .................. 327/147, 327/150, 156, 159; 331/1 R, 10, 17, 18; 375/294, 327, 376; 329/307, 325, 360; 332/127, 332/128; 455/75, 119
See application file for complete search history.

(56) References Cited

U.S. PATENT DOCUMENTS

| 5,596,599 A * | 1/1997 | Saito .............................. 375/149 |
| 7,522,005 B1 * | 4/2009 | Groe et al. ...................... 331/16 |
| 7,679,468 B1 * | 3/2010 | Groe et al. ..................... 332/128 |
| 2005/0186920 A1 | 8/2005 | Staszewski et al. |
| 2008/0214135 A1 | 9/2008 | Muhammad |
| 2009/0015338 A1 | 1/2009 | Frey |
| 2011/0299580 A1 * | 12/2011 | Sornin .......................... 375/224 |

* cited by examiner

*Primary Examiner* — Patrick O'Neill
(74) *Attorney, Agent, or Firm* — Novak Druce DeLuca + Quigg LLP

(57) ABSTRACT

A phase-locked loop comprising; an oscillator configured to output an oscillating signal in dependence on the control signal at an input of the oscillator; a phase detector and loop filter configured to output a low frequency compensation signal in dependence on the output of the oscillator and a reference signal; a correlator configured to frequency correlate an interferer signal and the low frequency compensation signal, and in dependence on that correlation generate a correlation signal; and an adaptive filter configured to adapt the interferer signal in dependence on the correlation signal to output a high frequency compensation signal; and a summation unit configured to combine the low frequency compensation signal and the high frequency compensation signal to form a control signal to drive the input of the oscillator.

21 Claims, 3 Drawing Sheets

PHASE-LOCKED LOOP

FIELD OF THE INVENTION

This invention relates to tuning phase-locked loops to reduce perturbations in the oscillator output caused by interfering signals. The present invention is particularly applicable to tuning such phase-locked loops in transmitters and transceivers.

BACKGROUND OF THE INVENTION

A phase-locked loop is a circuit including a voltage controlled oscillator (VCO) which is designed to control the VCO to generate an output signal having a predetermined frequency and/or phase relationship with a reference signal. A typical phase-locked loop is shown in FIG. 1.

The phase-locked loop comprises an oscillator 101. The output of the oscillator is output from the phase-locked loop circuit on line 105. Additionally, the output of the oscillator 101 is fed to an input of a phase/frequency detector (PFD) 102. The PFD 102 outputs a signal that is representative of the phase and/or frequency difference between a reference signal on line 106 and the signal output from the oscillator. The PFD output signal is filtered at a low pass filter 103 (loop filter) and fed back into the oscillator 101 as a control signal on line 107. The control signal 107 modifies the frequency of the oscillator. The frequency of the signal output by the phase-locked loop on line 105 can be changed by varying the frequency of the reference signal. Often, the reference signal is generated by a very stable oscillator whose frequency cannot be varied. Therefore, it can be beneficial to include a divider 104 in the loop so that the output frequency of the phase-locked loop can be varied without having to change the frequency of the reference signal.

An oscillator may be used to output an oscillating signal to drive a frequency mixer used in a transmitter or a transceiver. The frequency mixer may be used, for example, to upconvert a signal in a transmit chain and/or to downconvert a signal in a receive chain. A problem with oscillators in such environments is that they may pick up the signal transmitted from the transmitter/transceiver. The transmitted signal perturbs the output frequency of the oscillator thereby contributing significantly to the phase noise suffered by the oscillator. (Phase noise is rapid, random fluctuations in the phase of a wave caused by instabilities in the timing of the zero crossings of the wave, known as jitter. The zero crossings are the points at which a waveform plotted on a graph of output voltage (on the y-axis) against time (on the x-axis) crosses the x-axis.) When an oscillator comprising an inductor suffers interference from the electromagnetic field of a nearby transmitted signal, the transmitted signal can induce a current in the inductor. This can perturb the signal output from the oscillator so as to include frequency components in the interfering frequency band of the transmitted signal in addition to frequency components at the natural frequency of the oscillator.

Phase-locked loops, such as the one shown in FIG. 1, are often used to control the output of such oscillators. The signal output from the PFD 102 is representative of the phase and/or frequency difference between the reference signal on line 106 and the perturbed signal output from the oscillator. The signal output from the PFD 102 also includes high frequency components representative of the sum of the phases and/or frequencies of the reference signal and the perturbed signal output from the oscillator.

The loop filter 103 of the phase-locked loop attenuates frequencies outside of its passband. The passband of the loop filter is chosen so as to attenuate the high frequency components output from the PFD 102 that are representative of the sum of the phases and/or frequencies of the reference signal and the perturbed signal. The transmitted signal will typically have frequency components lying outside the passband of the loop filter 103 in addition to frequency components lying within the passband of the loop filter 103. Consequently, the perturbed signal will have corresponding frequency components. Therefore, in addition to the high frequency components mentioned above, the loop filter will additionally attenuate frequency components output from the PFD representative of the phase and/or frequency difference between the reference signal and the perturbed signal components lying outside the passband of the loop filter. Consequently, the output of the loop filter 103 is a signal representative of the phase and/or frequency difference between the reference signal and the perturbed signal components lying within the passband of the loop filter 103. This output signal is fed as a control signal to the oscillator 101 to modify the frequency of the oscillator.

In summary, the phase-locked loop tracks the disturbances caused by the part of the transmitted signal that lies within the passband of the loop filter. Under the control of the control signal 107, the oscillator modifies its oscillation frequency to reduce these disturbances.

A problem with the phase-locked loop of FIG. 1 is that it is not able to compensate for the disturbances caused by the part of the transmitted signal that lies outside the passband of the loop filter. This is because the part of the signal output from the PFD 102 that would provide the desired compensation signal for these disturbances is attenuated by the loop filter. The control input to the oscillator consequently does not comprise this desired compensation signal. As a result, the frequency of the signal output from the circuit on line 105 does not match the frequency of the reference signal since it is still perturbed as a result of the high frequency components of the transmitted signal. The perturbations are visible as significant sidebands in the signal output from the circuit on line 105.

It will be understood that this problem may apply to a phase-locked loop in any environment in which it is subject to interference from an interfering signal that has frequency components that lie outside the passband of the loop filter.

There is thus a need for an improved phase-locked loop design that reduces the perturbations in a signal output from a controlled oscillator caused by an interfering signal that lies outside the passband of the loop filter.

SUMMARY OF THE INVENTION

According to an embodiment of the invention there is provided a phase-locked loop comprising: an oscillator configured to output an oscillating signal in dependence on the control signal at an input of the oscillator; a phase detector and loop filter configured to output a low frequency compensation signal in dependence on the output of the oscillator and a reference signal; a correlator configured to frequency correlate an interferer signal and the low frequency compensation signal, and in dependence on that correlation generate a correlation signal; and an adaptive filter configured to adapt the interferer signal in dependence on the correlation signal to output a high frequency compensation signal; and a summation unit configured to combine the low frequency compensation signal and the high frequency compensation signal to form a control signal to drive the input of the oscillator.

Suitably, the oscillator comprises two variable capacitors connected in series, and the phase-locked loop further comprises a processor configured to receive the correlation signal and in dependence on the correlation signal to adjust the ratio of the capacitances of the two variable capacitors.

Preferably, the correlator is configured to identify frequency-correlated characteristics in the low frequency compensation signal and in the interferer signal, and to generate a correlation signal representative of the amplitude and phase of the frequency-correlated characteristics in the low frequency compensation signal relative to the amplitude and phase of the frequency-correlated characteristics in the interferer signal.

Suitably, the low frequency compensation signal is a real signal, the interferer signal is a complex signal, and the correlator is configured to generate a correlation signal that is a complex number.

Preferably, the adaptive filter is configured to adapt the amplitude and phase of the interferer signal to match the amplitude and phase of the frequency-correlated characteristics in the low frequency compensation signal to form an adapted interferer signal, and the adaptive filter is further configured to attenuate the low frequency part of the adapted interferer signal to form the high frequency compensation signal.

Preferably, the adaptive filter is configured to multiply the complex interferer signal by the complex correlation signal and take the real component of this multiplication to form the adapted interferer signal.

Suitably, the summation unit is configured to subtract the high frequency compensation signal from the low frequency compensation signal to form the control signal to drive the input of the oscillator.

Suitably, the oscillator comprises an inductor, the frequency of the oscillating signal being dependent on the inductance of the inductor, and the inductor is susceptible to interference.

Suitably, a supply voltage output is connected to the inductor by one of a plurality of taps, the phase-locked loop further comprising a processor configured to receive the correlation signal and in dependence on the correlation signal to change the tap by which the supply voltage is connected to the inductor.

Suitably, the inductor is a variable inductor whose inductance is controllable by the voltage at the input of the oscillator.

Suitably, the oscillator comprises a first variable capacitor that has a capacitance controllable by the control signal at the input of the oscillator.

Suitably, the oscillator also comprises a second variable capacitor, the capacitance of the second variable capacitor being controllable by the control signal at the input of the oscillator.

Suitably, the correlator and adaptive filter are implemented by means of software.

Suitably, the processor is implemented by means of software.

Suitably, the output of the loop filter is connected to a first input of the correlator and the output of a further filter is connected to a second input of the correlator, the further filter being configured to receive the interferer signal, and both the loop filter and the further filter being operable to attenuate high frequencies outside the same frequency band.

The interferer signal may be a frequency hopping signal.

According to another embodiment of the invention there is provided an integrated circuit comprising the phase-locked loop of the invention.

According to another embodiment of the invention there is provided a transmitter and the interferer signal may form part of a signal transmitted by the transmitter.

The oscillator may be configured to operate over a frequency range that overlaps with the transmission band of the transmitter.

According to another embodiment of the invention there is provided a transceiver comprising the transmitter, wherein the phase-locked loop is configured to drive a frequency mixer of at least one of a transmit chain and a receive chain of the transceiver.

According to another embodiment of the invention there is provided a method for driving an oscillator in a phase-locked loop, comprising: outputting from an oscillator an oscillating signal in dependence on a control signal at an input of the oscillator; outputting from a phase detector and loop filter a low frequency compensation signal in dependence on the output of the oscillator and a reference signal; frequency correlating at a correlator an interferer signal and the low frequency compensation signal, and in dependence on that correlation generating a correlation signal; adapting at an adaptive filter the interferer signal in dependence on the correlation signal and outputting a high frequency compensation signal; and combining at a summation unit the low frequency compensation signal and the high frequency compensation signal to form a control signal and driving the input of the oscillator with the control signal.

BRIEF DESCRIPTION OF THE DRAWINGS

The present invention will now by described by way of example with reference to the accompanying drawings. In the drawings.

DESCRIPTION OF THE PREFERRED EMBODIMENTS

Figure 2:
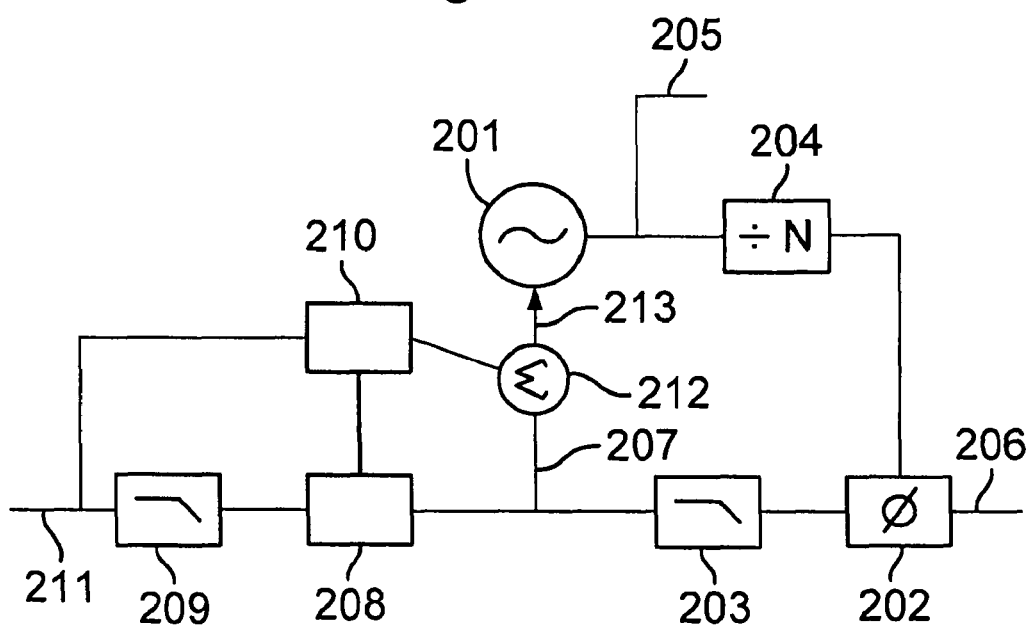
FIG. 2 is a schematic diagram of a phase-locked loop designed to reduce high frequency perturbations caused by an interfering signal.

FIG. 2 shows a schematic diagram of the general arrangement of a phase-locked loop designed to reduce high frequency perturbations caused by an interfering signal. Preferably, all the components of the phase-locked loop are formed on a single integrated circuit. Alternatively, they could be implemented wholly or partly through discrete components.

The phase-locked loop comprises an oscillator 201. The output of the oscillator is output from the phase-locked loop circuit on line 205. Additionally, the output of the oscillator 201 is fed to a divider 204. The output of the divider 204 is connected to a first input of a phase/frequency detector (PFD) 202. A reference signal on line 206 is connected to a second input of the PFD 202. Preferably, the reference signal is a clock signal generated by a crystal oscillator off chip. The output of the PFD is connected to the input of a first filter 203 (loop filter). This loop filter is suitably a low pass filter. The output of the loop filter is connected to a first input of a correlator 208. An interfering signal on line 211 is fed to a second filter 209. Preferably the second filter 209 has the same filter characteristics as the loop filter 203. In other words, preferably the second filter 209 is a low pass filter with the same passband as the loop filter 203. The output of the second filter 209 is connected to a second input of the correlator 208. The output of the correlator 208 is connected to a first input of an adaptive filter 210. The interfering signal on line 211 is connected to a second input of the adaptive filter 210. The output of the adaptive filter 210 is connected to a first input of a summation unit 212. The output of the loop filter 203 is connected to a second input of the summation unit 212. The output of the summation unit 212 forms the control input to the oscillator 201.

The oscillator 201 may pick up an interfering signal which perturbs the signal output from the oscillator, as described in the background to this invention. The feedback structure of FIG. 2 is designed to compensate for the disturbances caused by both the high and low frequency components of the interfering signal such that the oscillator quickly settles to generating a signal at the frequency of, or a multiple of, the reference signal 206. The structure of FIG. 2 uses the low frequency compensation signal generated by the standard phase-locked loop arrangement of FIG. 1 in order to estimate the signal required to compensate for the high frequency components of the interfering signal.

The signal output from the oscillator 201 is fed into a divider 204. The divider 204 divides the frequency of the signal by a factor. The divider is used in order to vary the frequency of the signal output from the phase-locked loop on line 205 without having to change the frequency of the reference signal. For example, if the divider 204 divides the signal frequency by 2, then the PFD 202 will output a control signal that increases the frequency of the oscillator 201 by a factor of 2 in order to match the frequency of the signal received by the PFD 202 to the frequency of the reference signal 206. The divider 204 may be used in circuits where it is desirable to output a frequency hopping signal. A frequency hopping signal is a signal which occupies a frequency band that varies over time according to a predetermined hopping sequence.

The phase-locked loop can suitably be implemented in a transmitter or transceiver. For example, it can be used to output an oscillating signal to drive a frequency mixer used to upconvert a signal in a transmit chain and/or to downconvert a signal in a receive chain. If the transmitter/transceiver transmits/receives frequency hopping signals, the phase-locked loop can suitably be used to generate frequency hopping oscillating signals with the desired hopping sequence to combine with the signal to be upconverted/downconverted. Transmitters/transceivers operating in accordance with the Bluetooth specifications use frequency hopping signals which hop over 79 different frequencies. The phase-locked loop is suitable for use in generating such signals.

Figure 1:
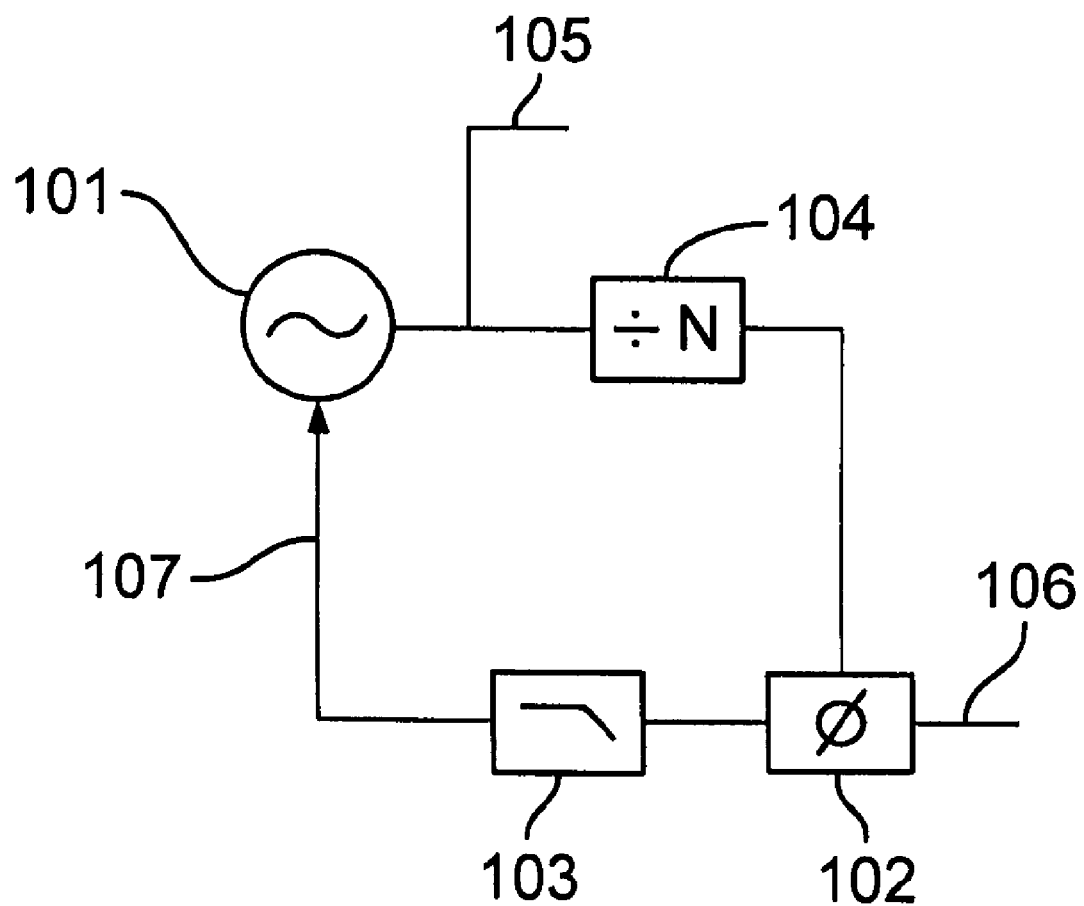
FIG. 1 is a schematic diagram of a typical phase-locked loop.

The PFD 202 and loop filter 203 operate as described in the background to this invention in relation to FIG. 1. The PFD 202 has as its inputs the output of the divider 204 and the reference signal on line 206. The output of the loop filter is a low frequency compensation signal representative of the phase and/or frequency difference between the reference signal and the perturbed signal components lying within the passband of the loop filter 203. The low frequency compensation signal is a voltage signal. It is suitable for inputting to the oscillator to modify the frequency of the oscillator so as to reduce the low frequency perturbations in the signal output from the oscillator. The low frequency compensation signal modifies the oscillator to compensate for the low frequency components of the interfering signal. Additionally, the low frequency compensation signal modifies the oscillator to compensate for low frequency interference from sources other than the interfering signal. Low frequency means within the passband of the loop filter.

As described in relation to the prior art, the oscillator may pick up an interfering signal. If the phase-locked loop is implemented in a transmitter/transceiver, the interfering signal may be the signal that the transmitter/transceiver transmits. The frequency band of the transmitted signal is likely to overlap with the frequency of the oscillator. The phase of the transmitted signal will typically be different to that of the oscillator and may be changing if the transmitter is phase modulated. Although the frequency characteristics of the interfering signal are known, the amplitude and phase of the interfering signal picked up by the oscillator are not known. The structure of FIG. 2 determines the amplitude and phase of the parts of the low frequency compensation signal that compensate for the low frequency components of the interfering signal, in order to estimate the amplitude and phase of a signal to compensate for the high frequency components of the interfering signal.

The interfering signal is fed into the input of the second filter 209 on line 211. The second filter has the same filter characteristics as the loop filter 203 and consequently attenuates signals outside of the same passband as loop filter 203. Preferably, the passband of the filter is 100 kHz to 300 kHz.

The signal output from the second filter 209 consists of the parts of the known interfering signal that lie in the bandwidth of the phase-locked loop, where the bandwidth is the passband of the loop filter 203 and the second filter 209. The signal output from the second filter 209 is input to the correlator 208. The correlator 208 correlates the parts of the interfering signal output from the second filter with the low frequency compensation signal output from the loop filter 203. The correlator 208 identifies common frequency characteristics in the two signals, if present. Although the frequencies of these characteristics in the respective signals coincide, the amplitude and phase of the characteristics in one signal is likely to differ from the amplitude and phase of the characteristics in the other signal. This is because the amplitude and phase of the interfering signal input to the phase-locked loop on line 211 is likely to be different to the amplitude and phase of the interfering signal picked up by the oscillator. The correlator calculates the amplitude and phase of the common frequency characteristics in the low frequency correlation signal relative to the amplitude and phase of the common frequency characteristics in the interfering signal. These relative amplitude and phase values are output from the correlator as the correlation signal. The interfering signal is likely to be a complex signal. The interfering signal may be a baseband signal at an intermediate frequency (IF). The low frequency compensation signal is a real signal. The correlator generates a complex number. The real component of the complex number represents the amplitude of the common frequency characteristics in the low frequency correlation signal relative to the amplitude of the common frequency characteristics in the interfering signal. The imaginary component of the complex number represents the phase of the common frequency characteristics in the low frequency correlation signal relative to the phase of the common frequency characteristics in the interfering signal. The correlation signal contains information suitable for use in adapting the interfering signal to produce a high frequency compensation signal.

The correlation signal is input to the adaptive filter 210. The interfering signal on line 211 is also input to the adaptive filter 210. Under the control of the correlation signal, the adaptive filter adapts this interfering signal to form a signal that, when combined with the low frequency compensation signal in the summation unit 212, compensates for the high frequency components of the oscillator output that are due to the interfering signal picked up by the oscillator. The adaptive filter 210 preferably operates by adapting the amplitude and phase of the interfering signal to match the amplitude and phase of the common frequency characteristics in the low frequency compensation signal to form an adapted interfering signal. The adaptive filter may do this by multiplying the complex number correlation signal by the complex interfering signal and taking the real component of this multiplication to form the adapted interfering signal.

The adaptive filter further comprises a high pass filter. The high pass filter passes high frequencies which the loop filter and second filter attenuate. The high pass filter attenuates low frequencies which the loop filter and second filter pass. Preferably there is no significant overlap between the passband of the high pass filter and the passband of the loop filter 203 and second filter 209. The low frequency components of the adapted interfering signal are attenuated in the high pass filter of the adaptive filter. The output of the high pass filter is a signal representative of the high frequency perturbations in the oscillator output that are caused by the oscillator picking up the interfering signal.

The output of the high pass filter needs to be inverted to produce a high frequency compensation signal. The high frequency compensation signal is a voltage signal. It is suitable for inputting to the oscillator to modify the frequency of the oscillator so as to reduce the high frequency perturbations in the signal output from the oscillator that are due to the high frequency components of the interfering signal that the oscillator picks up. The inversion can be implemented in the adaptive filter 210. In this case, the summation unit 212 is arranged to add the output of the adaptive filter to the signal output from the loop filter 203 to form the control signal input to the oscillator on line 213. Alternatively, the inversion can be implemented by the summation unit 212. In this case, the summation unit 213 is arranged to deduct the signal output from the high pass filter from the signal output from the loop filter 203 to form the control signal input to the oscillator on line 213. The control signal input to the oscillator on line 213 is used to modify the frequency of the oscillator so as to reduce the perturbations in the signal output from the oscillator. The control signal is a combination of the high frequency compensation signal and the low frequency compensation signal. The high frequency compensation signal has frequency characteristics that lie in a high frequency band. This high frequency band is the same as the passband of the high pass filter. The low frequency compensation signal has frequency characteristics that lie in a low frequency band. This low frequency band is the same as the passband of the loop filter. The frequency characteristics of the high frequency compensation signal and the frequency characteristics of the low frequency compensation signal do not substantially overlap.

It is to be understood that the above description is not limited to the case where complete minimisation of the perturbations in the signal output from the oscillator (caused by the interfering signal frequency components) is achieved by the control signal fed to the oscillator. For example, phase-locked loops that significantly reduce perturbations in the signal output from the oscillator that are caused by the interfering signal may be advantageous in some circumstances.

Preferably, the adaptive filter is implemented in the digital domain. For example, it may be a finite impulse response (FIR) filter with adjustable taps. The taps may be adjusted by use of a local maximum fitting (LMF) algorithm.

Alternatively software may be used to implement the functionality of the second filter 209, the correlator 208, the adaptive filter 210 and the summation unit 212.

Figure 3:
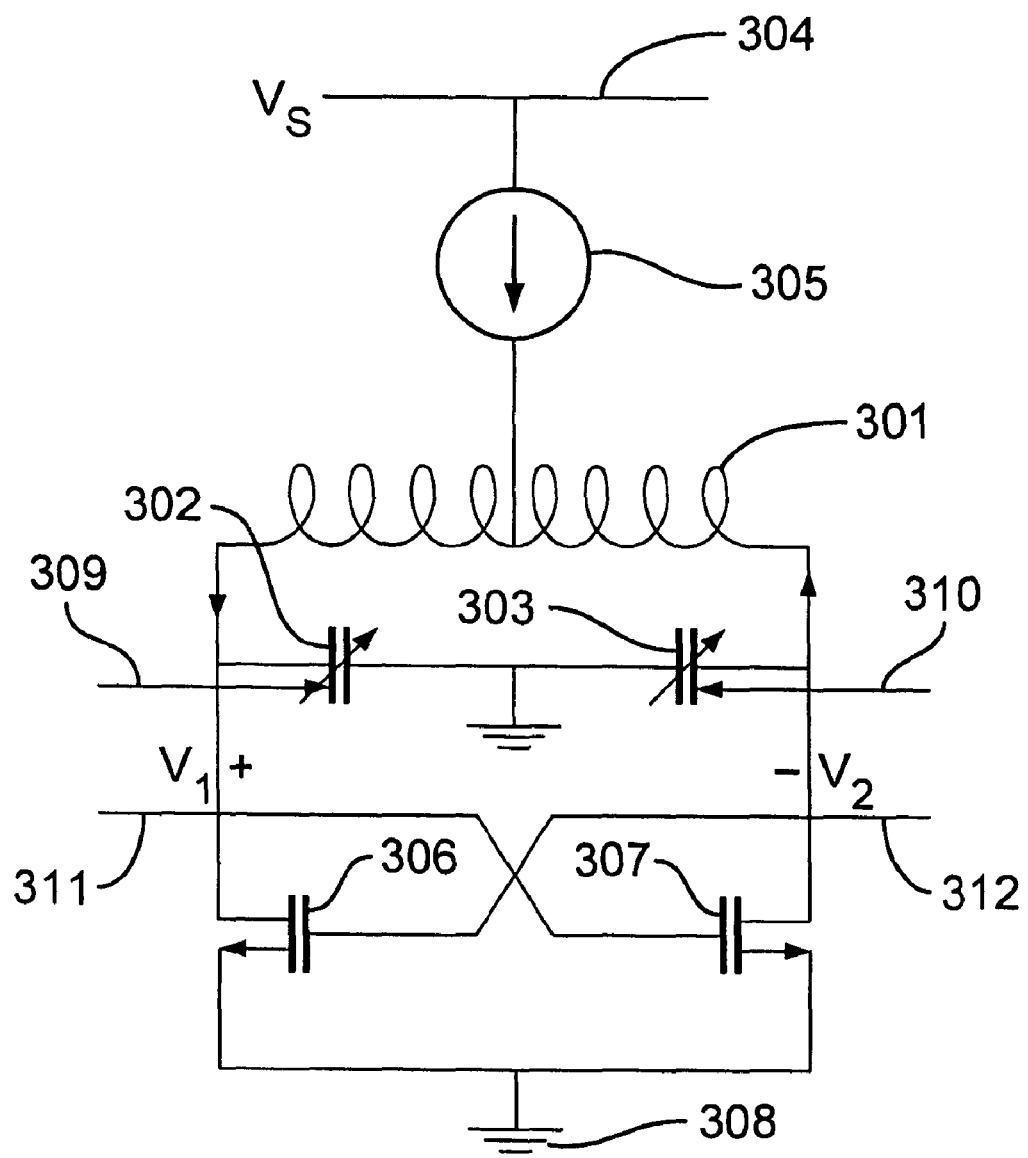
FIG. 3 is a schematic diagram of an oscillator suitable for use in the phase-locked loop of FIG. 2.

FIG. 3 is a schematic diagram of an example oscillator of the phase-locked loop shown in FIG. 2.

A constant supply voltage, Vs, on line 304 is connected to the input of a current source 305. The output of the current source is connected to the centre of an inductor 301. The inductor 301 is connected in parallel with two CDACs (variable capacitors) 302, 303. The CDACs are connected in series with each other. The CDACs 302, 303 are connected to ground at their midpoint. The CDACs 302, 303 receive control signals on lines 309 and 310 respectively. Either one of these control signals may be the voltage control input from the phase-locked loop of FIG. 2 on line 213. Alternatively, the two variable capacitors may be controlled independently by control signals on lines 309 and 310. The inductor and CDACs are connected in parallel with a differential transistor pair 306, 307. The differential transistor pair is connected in parallel to ground 308. The oscillating output voltage signal of the circuit is the difference between the voltages V1 and V2 on lines 311 and 312 respectively. V1 is the voltage input to the first transistor 307 of the differential pair. V2 is the voltage input to the second transistor 306 of the differential pair.

The transistors are preferably MOSFETs. The input of the first transistor 307 is connected to an output of the second transistor 306. Similarly, the input of the second transistor 306 is connected to an output of the first transistor 307. The other connection to each transistor is connected to ground 308.

Current is applied to the circuit via the current source 305. The inductor and capacitors generate an oscillating signal at their resonant frequency, given by:

$$f = 1/2\pi\sqrt{LC}$$

where f is the resonant frequency, L is the inductance of the inductor and C is the combined capacitance of the capacitors. Standard units apply. The inductor and capacitors act together as a tank holding the oscillation energy. The differential transistor pair act as common-source amplifiers to amplify the resonating oscillating signal generated by the capacitors and inductor. V1 and V2 are common mode signals as opposed to differential signals.

The voltage control signals on lines 309 and 310 adjust the values of the capacitances of the capacitors 302 and 303 respectively, in order to adjust the resonant frequency of the oscillator in accordance with the above equation. Preferably, the voltage control signal 213 from the phase-locked loop of FIG. 2 is divided by two and input equally to the lines 309 and 310. Alternatively, the control signal 213 could be input on either line 309 or 310 with no control input to the other control line 310 or 309 respectively. Any other suitable combination of control signals on lines 309 or 310 could alternatively be used.

The resonant frequency of the oscillator can be modified by changing the values of the capacitances under the control of the control signals 309 and 310 as described above. Alternatively, the resonant frequency of the oscillator can be modified by changing the inductance of the inductor under the control of the control line 213 of FIG. 2. This adjusts the resonant frequency of the oscillator in accordance with the above equation. As a further alternative, both the capacitor[s] and the inductor could be modified in accordance with the control signal 213.

The control of the oscillator by the control input on line 213 described above is carried out in real time, in other words whilst the chip is in operation.

Suitably, the oscillator is additionally calibrated with the interfering signal during a test period or when the chip is started up for the following reason. The interfering signal is picked up by the inductor in the oscillator as previously described. The effect of this pickup is reduced by making the oscillator circuit as symmetrical as possible such that equal disturbances are present at the gates of the two transistors 306 and 307. Due to manufacturing variations in the components of the oscillator and the environment to which the oscillator is subjected, particularly the effects of the interfering signal, the oscillator may not initially be perfectly symmetrical. An initial calibration to increase the symmetry of the components in the oscillator can be carried out during a test period or at start up of the chip as follows.

The correlation signal output from the correlator 208 of FIG. 2 is input to a processor. The processor uses the correlation signal to gauge the level of disturbances caused by the interfering signal to the oscillator. For example, if the correlation signal is zero then the processor deduces that there is no pickup of the interfering signal in the oscillator. The processor outputs a control signal in dependence on the correlation signal. This control signal is used to adjust the symmetry of the oscillator circuit (about a line which divides the oscillator circuit of FIG. 3 into a left hand side and a right hand side) in order to reduce the disturbances caused by the pickup of the interfering signal. The control signal may be used in one or both of the following two ways.

Firstly, the control signal may be used to alter the ratio of the capacitances of the variable capacitors 306 and 307 with respect to each other thereby changing the relative capacitance on the left and right hand sides of the oscillator circuit. For example, the control signal may be applied to one or the other or both of control lines 309 and 310. Alternatively, the control signal may be applied to the capacitors 306 and 307 via different control lines to control lines 309 and 310.

Secondly, the control signal may be used to change the point at which the supply voltage output is connected to the inductor (via the current source 301). For example, there may be a plurality of taps which connect the supply voltage to the inductor. These taps may connect to the inductor at different points along the length of the inductor. The tap used to feed the voltage supply to the inductor can be changed under the control of the control signal output from the processor. This changes the relative inductance on the two sides of the feed line i.e. on the left and right hand sides of the oscillator circuit.

Once the oscillator circuit has been calibrated as described above to increase its symmetry, it is preferably not recalibrated during operation of the chip. Alternatively, the calibration may be carried out during operation of the chip, either continuously or at discrete intervals.

The initial calibration using the processor may be implemented in software.

Suitably, the inductor has a layout in the shape of a figure-of-8.

The phase-locked loop can suitably be implemented on a chip which further comprises a second inductor that generates a frequency within the bandwidth of the phase-locked loop or a harmonic of it. The phase-locked loop reduces perturbations caused by the field radiated by the second inductor thereby minimising the coupling between the VCO and the second inductor.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

The invention claimed is:

1. A phase-locked loop comprising:
an oscillator configured to output an oscillating signal in dependence on the control signal at an input of the oscillator;
a phase detector and loop filter configured to output a low frequency compensation signal in dependence on the output of the oscillator and a reference signal;
a correlator configured to frequency correlate an interferer signal and the low frequency compensation signal, and in dependence on that correlation generate a correlation signal; and
an adaptive filter configured to adapt the interferer signal in dependence on the correlation signal to output a high frequency compensation signal; and
a summation unit configured to combine the low frequency compensation signal and the high frequency compensation signal to form a control signal to drive the input of the oscillator.

2. A phase-locked loop as claimed claim 1, wherein the oscillator comprises two variable capacitors connected in series, and the phase-locked loop further comprises a processor configured to receive the correlation signal and in dependence on the correlation signal to adjust the ratio of the capacitances of the two variable capacitors.

3. A phase-locked loop as claimed in claim 2, wherein the correlator is configured to identify frequency-correlated characteristics in the low frequency compensation signal and in the interferer signal, and to generate a correlation signal representative of the amplitude and phase of the frequency-correlated characteristics in the low frequency compensation signal relative to the amplitude and phase of the frequency-correlated characteristics in the interferer signal.

4. A phase-locked loop as claimed in claim 3, wherein the low frequency compensation signal is a real signal, the interferer signal is a complex signal, and the correlator is configured to generate a correlation signal that is a complex number.

5. A phase-locked loop as claimed in claim 3, wherein
the adaptive filter is configured to adapt the amplitude and phase of the interferer signal to match the amplitude and phase of the frequency-correlated characteristics in the low frequency compensation signal to form an adapted interferer signal, and the adaptive filter is further configured to attenuate low frequencies of the adapted interferer signal to form the high frequency compensation signal.

6. A phase-locked loop as claimed in claim 5, wherein the adaptive filter is configured to multiply the complex interferer signal by the complex correlation signal and take the real component of this multiplication to form the adapted interferer signal.

7. A phase-locked loop as claimed in claim 2, wherein the processor is implemented by software.

8. A phase-locked loop as claimed in claim 1, wherein the summation unit is configured to subtract the high frequency compensation signal from the low frequency compensation signal to form the control signal to drive the input of the oscillator.

9. A phase-locked loop as claimed in claim 1, wherein the oscillator comprises an inductor configured to output the oscillating signal with a frequency dependent on the inductance of the inductor, and the inductor is configured to be susceptible to interference.

10. A phase-locked loop as claimed in claim 9, further comprising a supply voltage output connected to the inductor by one of a plurality of taps, and further comprising a processor configured to receive the correlation signal and in dependence on the correlation signal to change the one of plurality of taps by which the supply voltage is connected to the inductor to another of the plurality of taps.

11. A phase-locked loop as claimed in claim 9, wherein the inductor is a variable inductor whose inductance is controllable by the voltage at the input of the oscillator.

12. A phase-locked loop as claimed in claim 1, wherein the oscillator comprises a first variable capacitor that has a capacitance controllable by the control signal at the input of the oscillator.

13. A phase-locked loop as claimed in claim 12, wherein the oscillator comprises a second variable capacitor, the capacitance of the second variable capacitor being controllable by the control signal at the input of the oscillator.

14. A phase-locked loop as claimed in claim 1, wherein the correlator and adaptive filter are implemented by means of software.

15. A phase-locked loop as claimed in claim 1, wherein the output of the loop filter is connected to a first input of the correlator and the output of a further filter is connected to a second input of the correlator, the further filter being configured to receive the interferer signal, and both the loop filter and the further filter being operable to attenuate high frequencies outside the same frequency band.

16. A phase-locked loop as claimed in claim 1, wherein the interferer signal is a frequency hopping signal.

17. An integrated circuit comprising the phase-locked loop as claimed in claim 1.

18. A transmitter comprising the phase-locked loop as claimed in claim 1, wherein the interferer signal forms part of a signal transmitted by the transmitter.

19. A transmitter as claimed in claim 18, wherein the oscillator is configured to operate over a frequency range that overlaps with the transmission band of the transmitter.

20. A transceiver comprising the transmitter as claimed in claim 18, wherein the phase-locked loop is configured to drive a frequency mixer of at least one of a transmit chain and a receive chain of the transceiver.

21. A method for driving an oscillator in a phase-locked loop, comprising:
  outputting from an oscillator an oscillating signal in dependence on a control signal at an input of the oscillator;
  outputting from a phase detector and loop filter a low frequency compensation signal in dependence on the output of the oscillator and a reference signal;
  frequency correlating at a correlator an interferer signal and the low frequency compensation signal, and in dependence on that correlation generating a correlation signal;
  adapting at an adaptive filter the interferer signal in dependence on the correlation signal and outputting a high frequency compensation signal; and
  combining at a summation unit the low frequency compensation signal and the high frequency compensation signal to form a control signal and driving the input of the oscillator with the control signal.

* * * * *